United States Patent
Yang et al.

(10) Patent No.: US 6,318,679 B1
(45) Date of Patent: Nov. 20, 2001

(54) APPARATUS FOR MOUNTING COMPUTER PERIPHERAL EQUIPMENT

(75) Inventors: Andy K. Yang, Hayward; Phillip Ting, San Jose, both of CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/056,077

(22) Filed: Apr. 6, 1998

(51) Int. Cl.[7] ................................................. G12B 9/00
(52) U.S. Cl. ..................... 248/27.1; 248/27.3; 248/201; 361/605; 312/223.3
(58) Field of Search .................. 248/27.1, 27.3, 248/201, 694; 361/685, 725, 726, 727; 312/223.2

(56) References Cited

U.S. PATENT DOCUMENTS

| | | | |
|---|---|---|---|
| 4,960,384 | * 10/1990 | Singer et al. | 361/685 X |
| 5,142,447 | * 8/1992 | Cooke et al. | 361/685 |
| 5,227,954 | * 7/1993 | Twigg | 361/685 |
| 5,262,923 | * 11/1993 | Batta et al. | 361/685 |
| 5,332,306 | * 7/1994 | Babb et al. | 361/685 X |
| 5,510,955 | * 4/1996 | Taesang | 361/726 |
| 5,515,237 | * 5/1996 | Ogami et al. | 361/726 |
| 5,595,501 | * 1/1997 | Ho | 361/685 X |
| 5,654,873 | * 8/1997 | Smithson et al. | 361/685 |
| 5,682,291 | * 10/1997 | Jeffries et al. | 361/685 |
| 5,683,159 | * 11/1997 | Johnson | 361/685 X |
| 5,779,197 | * 7/1998 | Kim | 248/27.1 |
| 5,828,547 | * 10/1998 | Francovich et al. | 361/685 |
| 5,887,829 | * 3/1999 | Wong et al. | 248/27.1 |

* cited by examiner

Primary Examiner—Anita King
Assistant Examiner—Kimberly Wood

(57) ABSTRACT

An apparatus for mounting computer peripheral equipment, such as disk drives or CD ROMs, comprises a drive cage and rails. The drive cage, a part of a computer chassis, defines several bays for receiving disk drives or CD ROMs therein. The drive cage has side walls forming bends whereby each pair of bends defines a receiving channel in each bay, and spring tabs project into each bay. Two rails each having a leading end and spring fingers are attached to sides of the CD ROM for slidably mounting in the corresponding bay of the drive cage. The leading end of the rail facilitates alignment the receiving channel. The spring fingers abut against with the bend of the channel to prevent clearance from forming between the bend and the rail. When the CD ROM is fully inserted into the bay, the spring tabs are attached to the rail thereby providing good grounding and easy installation capabilities.

1 Claim, 8 Drawing Sheets

APPARATUS FOR MOUNTING COMPUTER PERIPHERAL EQUIPMENT

BACKGROUND OF THE INVENTION

1. Field of the Invention

The present invention relates to an apparatus for incorporating peripheral equipment such as a CD ROM or a disk drive into a computer and, more particularly, to side rails having spring fingers mounted to sides of the peripheral equipment for slidably installing in a cage of the computer having spring tabs on opposite inner sides thereof.

2. The Related Art

Peripheral equipment such as a disk drive or a CD ROM can be installed in a computer chassis in various ways. The most common way is by screw mounting the CD ROM directly to the computer chassis which makes installation and removal thereof time-consuming and laborious. As the computer industry progresses, other apparatuses have been developed which facilitate installation and removal of CD ROMs and disk drives. Such an apparatus, disclosed in U.S. Pat. Nos. 5,262,923, 5,332,306, and 5,510,955, comprises two flat rectangular side rails which are mounted to opposite sides of the CD ROM by screws. Bends or rectangular plates are provided in a bay of the computer chassis where the CD ROM is to be mounted and are adapted for slidably engaging with the side rails. The CD ROM is fully inserted into the bay and secured against movement by screwing the side rails to the chassis by screws, by tightening a screw to abut against the CD ROM itself, or by the side rails snapping the computer chassis.

In the assembly described above, clearance always exists between the CD ROM and the computer chassis resulting in a loose engagement therebetween. Thus, damage to the CD ROM caused by shock can not be resisted by this structure.

U.S. Pat. No. 5,599,080 describes a pair of sliding devices mounted to opposite sides of a disk drive and forming a lateral channel and an opening on one end for sliding on wheels mounted onto the walls of the computer chassis. The mounting of the wheels becomes very tedious and complex thereby increasing the cost of manufacturing the chassis. Furthermore, clearance exists between the wheels and the sliding devices resulting in a loose engagement between the disk drive and the computer chassis.

Clearance between the wheels and the sliding devices also prevents the disk drive from properly connecting with the chassis and grounding. Electromagnetic interference (EMI) emitting through the clearance may be harmful to people which is a very serious defect for precise operation of the computer and should be avoided.

Therefore, an improved apparatus for securely mounting computer peripheral equipment to a computer chassis is required to overcome the above mentioned defects of the prior art.

SUMMARY OF THE INVENTION

In view of the foregoing, an object of the present invention is to provide rails comprising spring fingers attached to sides of computer peripheral equipment for securely mounting to a computer chassis.

Another object of the present invention is to provide a computer chassis comprising spring tabs for slidably mounting and securing sides of computer peripheral equipment thereto.

A further object of the present invention is to provide computer peripheral equipment with proper grounding capabilities and sufficient EMI protection.

To achieve the above objects, an apparatus for mounting computer peripheral equipment, such as disk drives or CD ROMs, in accordance with the present invention comprises a drive cage and rails. The drive cage, a part of a computer chassis, defines several bays for receiving disk drives or CD ROMs therein. The drive cage has side walls forming bends whereby each pair of bends defines a receiving channel in each bay, and spring tabs project into each bay. Two rails each having a leading end and spring fingers are attached to sides of the CD ROM for slidably mounting in the corresponding bay of the drive cage. The leading end of the rail facilitates alignment with the receiving channel. The spring fingers abut against the bend of the channel to prevent clearance from forming between the bend and the rail. When the CD ROM is fully inserted into the bay, the spring tabs are attached to the rail thereby providing good grounding and easy installation capabilities.

DETAILED DESCRIPTION OF THE PREFERRED EMBODIMENTS

Figure 1:
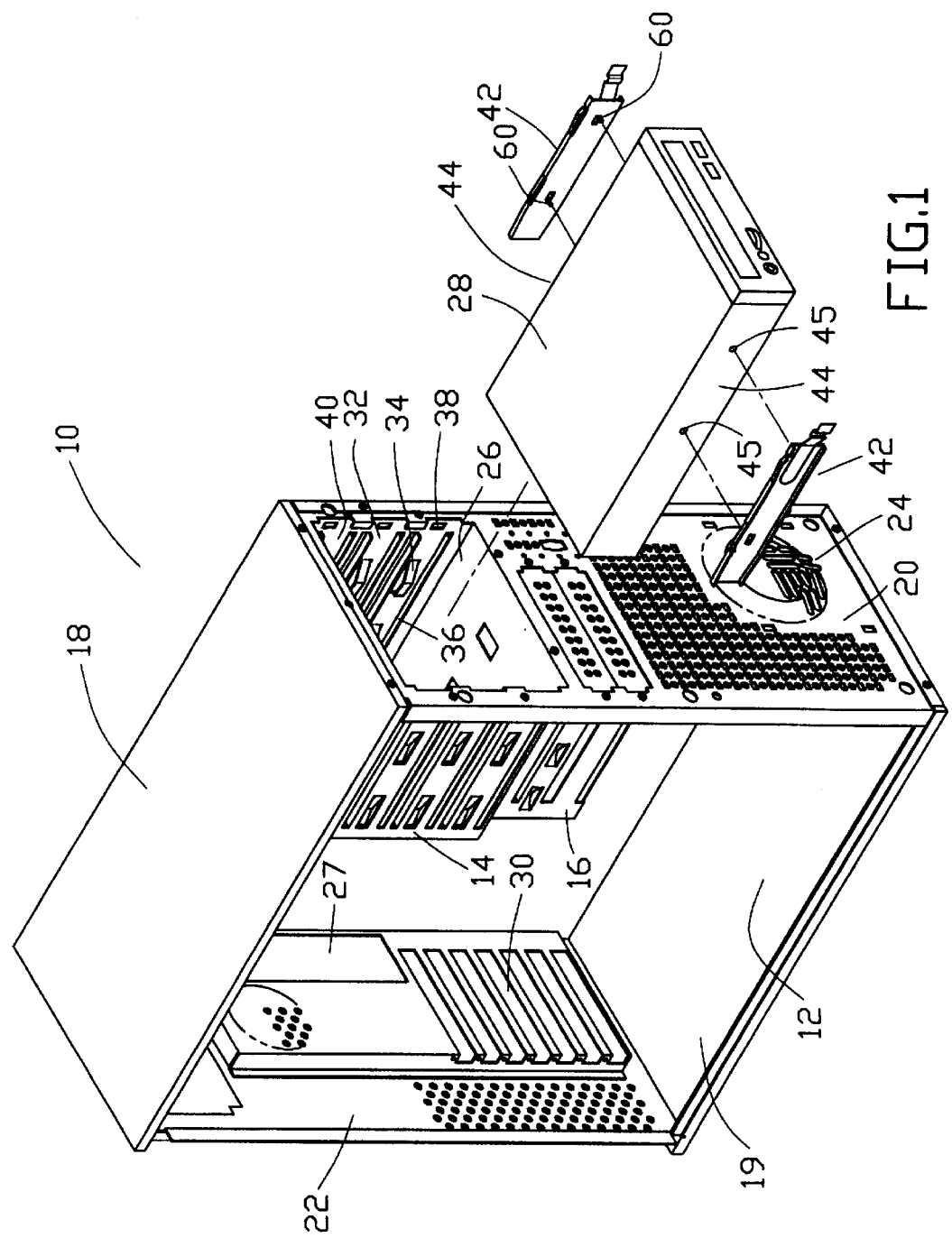
FIG. 1 is an exploded view of a preferred embodiment of a apparatus for mounting peripheral equipment of a computer to an enclosure thereof in accordance with the present invention.

References will now be made in detail to the preferred embodiments of the present invention. For a better understanding, most of like components are designated by like reference numerals throughout the various figures in the embodiments.

Referring to FIG. 1, a computer chassis 10 includes a base frame 12, a "5.25 inch" drive cage 14, a "3.5 inch" drive cage 16, and a top cover 18. The U-shaped base frame 12 comprises a base panel 19, a front panel 20 and a rear panel 22. The front panel 20 is perpendicular to the base panel 19 and defines a plurality of vent holes 24 therein for dissipating heat generated by a CPU (not shown). The front panel 20 also forms openings 26 for receiving disk drives or a CD ROM 28. The rear panel 22 is also perpendicular to the base panel 19 and forms an I/O area 27 for receiving connectors and slots 30 for fixing expansion cards (not shown) thereto. The front panel 20 and the rear panel 22 are respectively and perpendicularly joined to the base panel 19 at opposite ends thereof. The top cover 18 is mounted to the front panel 20 and the rear panel 22 opposite the base panel 19.

The drive cage 14 is mounted to the front panel 20 and the top cover 18 for installation of a "5.25 inch" disk drive or CD ROM 28. The drive cage 16 is mounted to the drive cage 14 and the front panel 20 for installation of a "3.5 inch" disk drive (not shown). The drive cages 14, 16 are different in dimension but have the same structure for receiving disk drives or CD ROMs, therefore, only the drive cage 14 is used for description purposes.

The drive cage 14 is a rectangular box forming an opening 26 for receiving the CD ROM 28. Two opposite side walls 32 have a plurality of protruding spring tabs 34, bends 36, and holes 38. The drive cage 14 is divided into several bays 40 for receiving one CD ROM 28. Each bay 40 forms one pair of elongate bends 36 on the side wall 32, two spring tabs 34 between the bends 36, and a hole 38 in a front portion near the opening 26 of the bay 40. A rail 42 has two opposite pins 60 engaging with corresponding holes 45 defined in sides 44 of the CD ROM 28 and attached thereto. Thus, the CD ROM 28 with mounted rails 42 can be slidably inserted into the corresponding bay 40.

Figure 2:
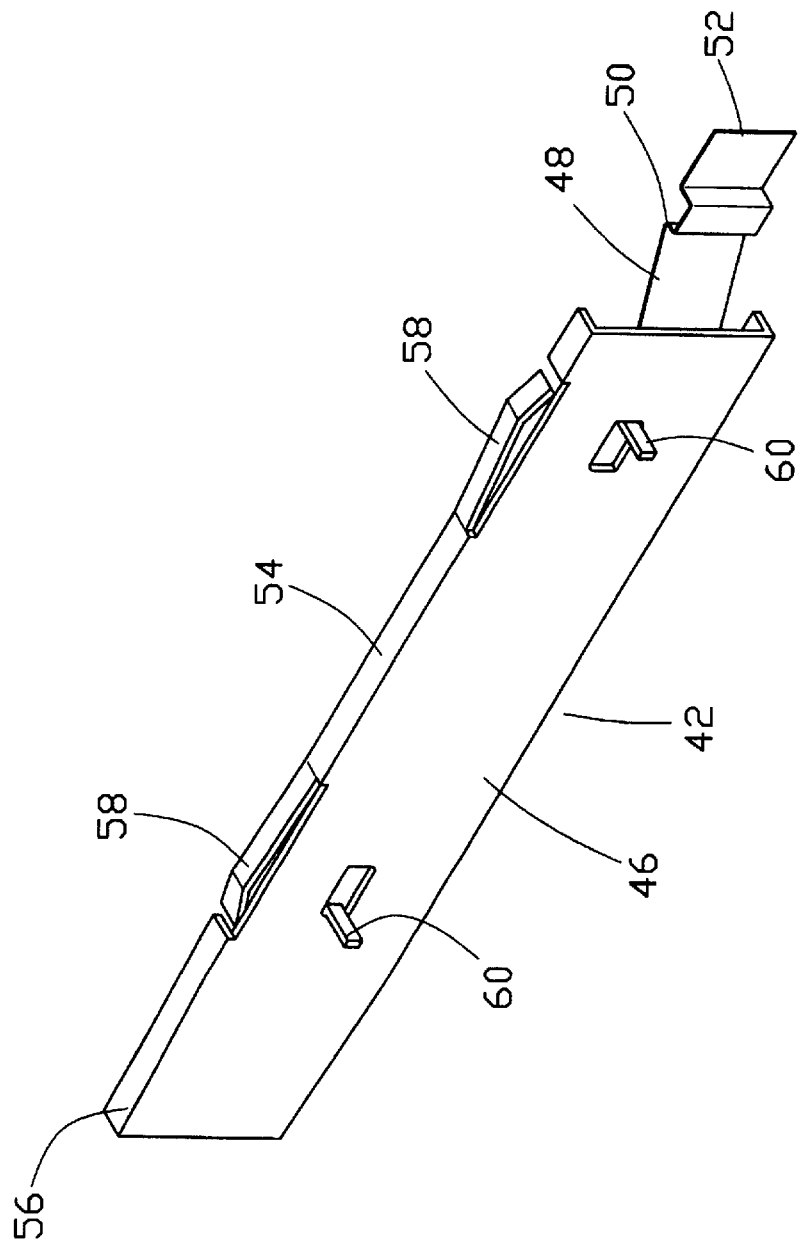
FIG. 2 is a perspective view of the preferred embodiment of a rail in accordance with the present invention.

As shown in FIG. 2, each rail 42 includes a elongate flat main body 46, and a latch 48 mounted to the main body 46 forming a snap 50 for engaging with the computer chassis and a extension plate 52 for releasing the engagement. The main body 46 forms flanges 54 along each longitudinal side and a leading end 56. Two spring fingers 58 are formed on one longitudinal side of the main body 46.

Figure 3:
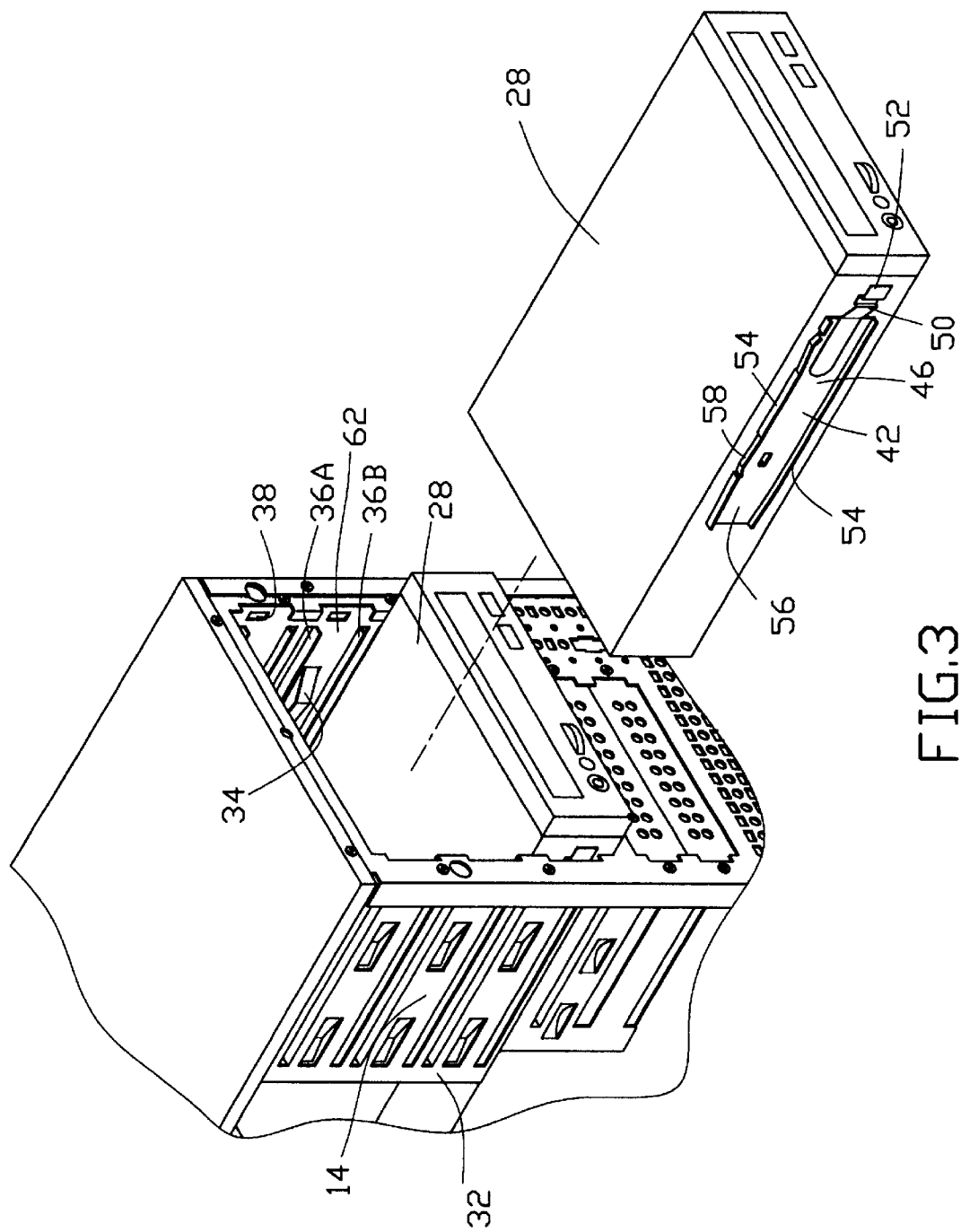
FIG. 3 is a partial perspective view of FIG. 1 showing the rails mounted to two CD ROMs, one CD ROM inserted into a bay of a drive cage and the other CD ROM outside the bay.

Referring to FIG. 3, the rails 42 are attached to opposite sides 44 of the CD ROM 28 for insertion thereof into the corresponding bay 40. The rail 42 is slidably receiving in a receiving channel 62 formed by the bends 36A, 36B. The spring tabs 34 attached to the main body 46 of the rail 42 maintain electrical grounding and mechanical connection between the CD ROM 28 and the drive cage 14. The snap 50 of the latch 48 engages with the holes 38 for firmly securing the CD ROM 28 to the drive cage 14.

Figure 4A:
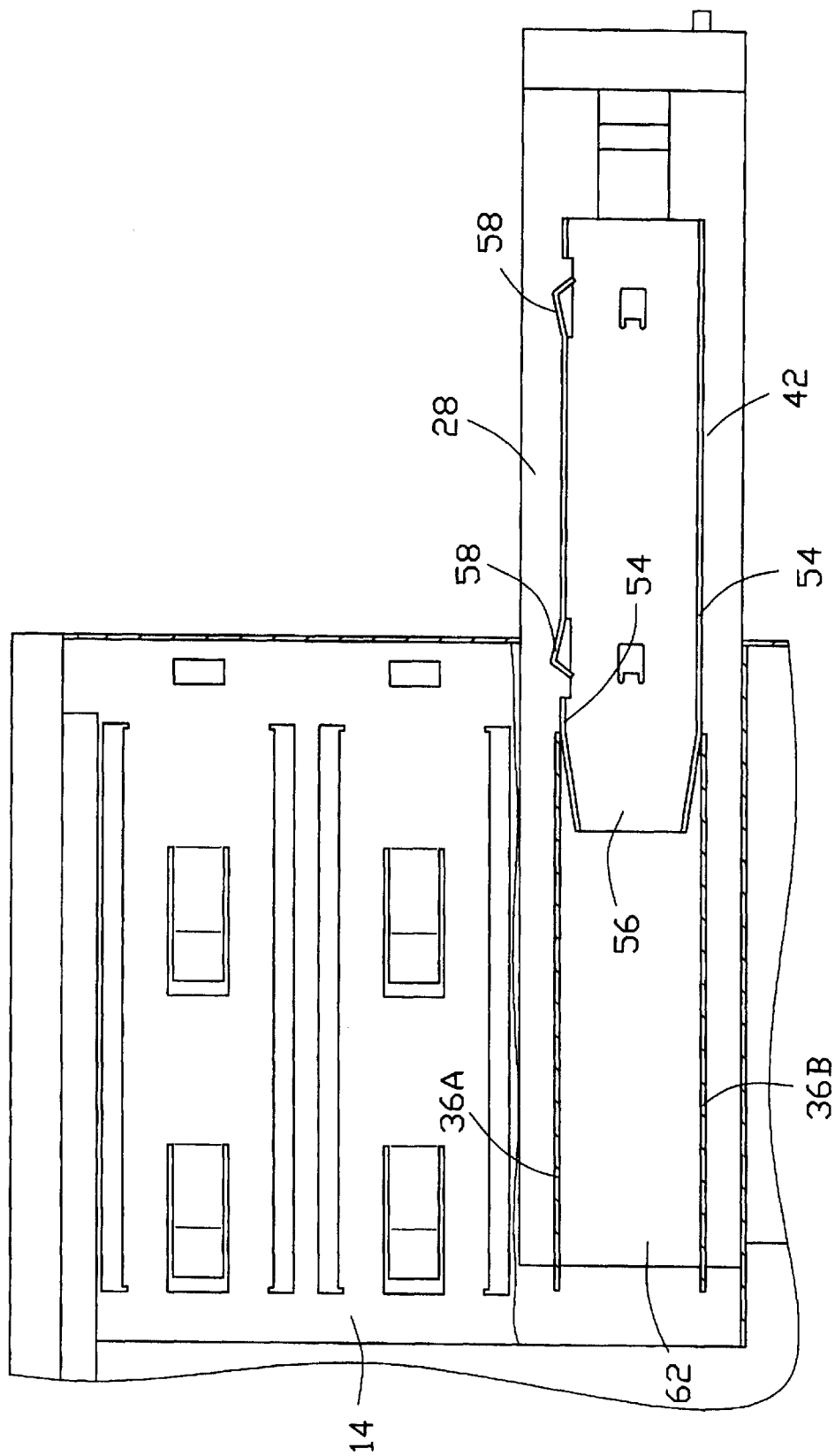
FIGS. 4(A) and 4(B) are partial cross-sectional views of the preferred embodiment of the present invention showing successive assembly of the CD ROM into the bay.
Figure 4B:
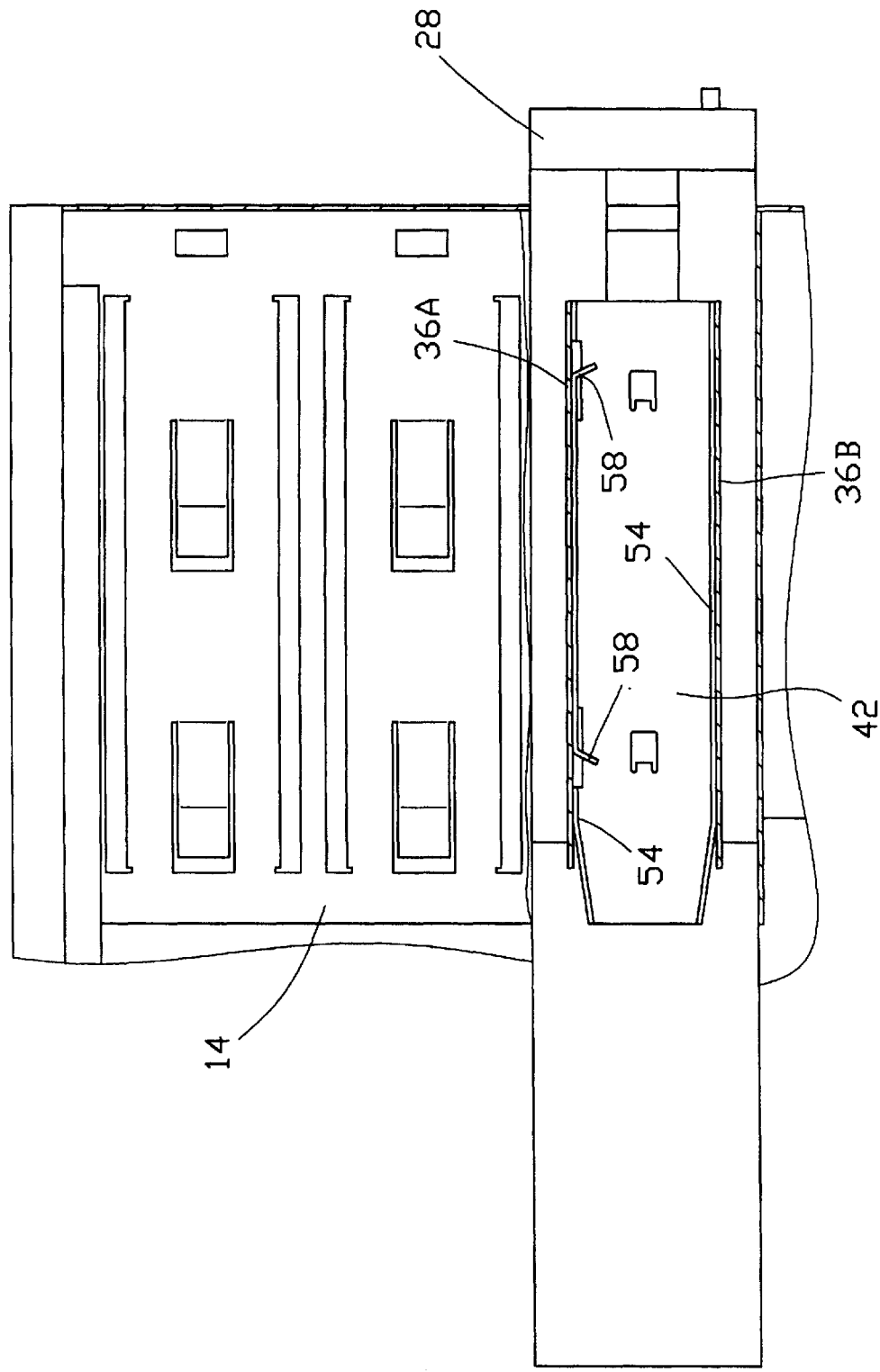

Referring to FIG. 4(A), the CD ROM 28 is partially inserted into the drive cage 14. The leading end 56 of the rail 42 aligns with the receiving channel 62. The upper bend 36A and the lower bend 36B are attached to the flange 54. As shown in FIG. 4(B), the CD ROM 28 is fully inserted into the drive cage 14. The upper bend 36A urges the spring fingers 58 downward, and the resilience of the spring fingers 58 prevent clearance from being formed between the bends 36 and the rail 42, therefore, the CD ROM 28 can be more firmly installed.

Figure 5:
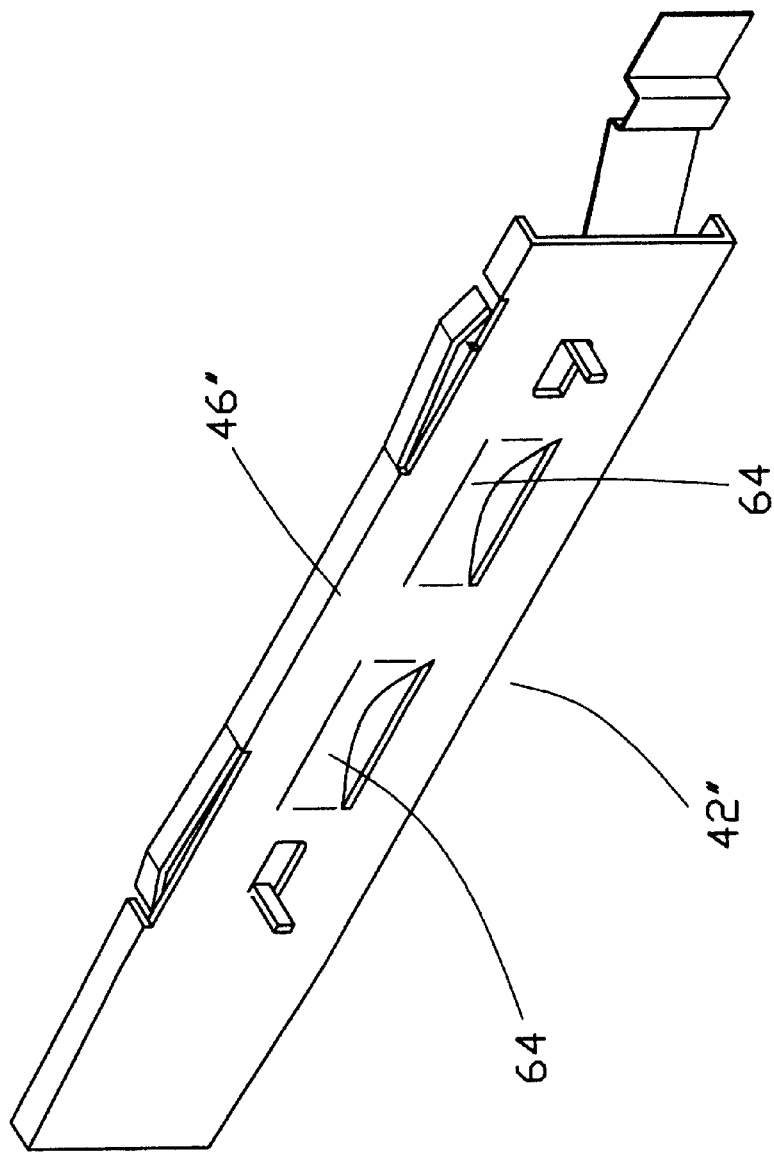
FIG. 5 is a perspective view of a second embodiment of a rail in accordance with the present invention.
Figure 6:
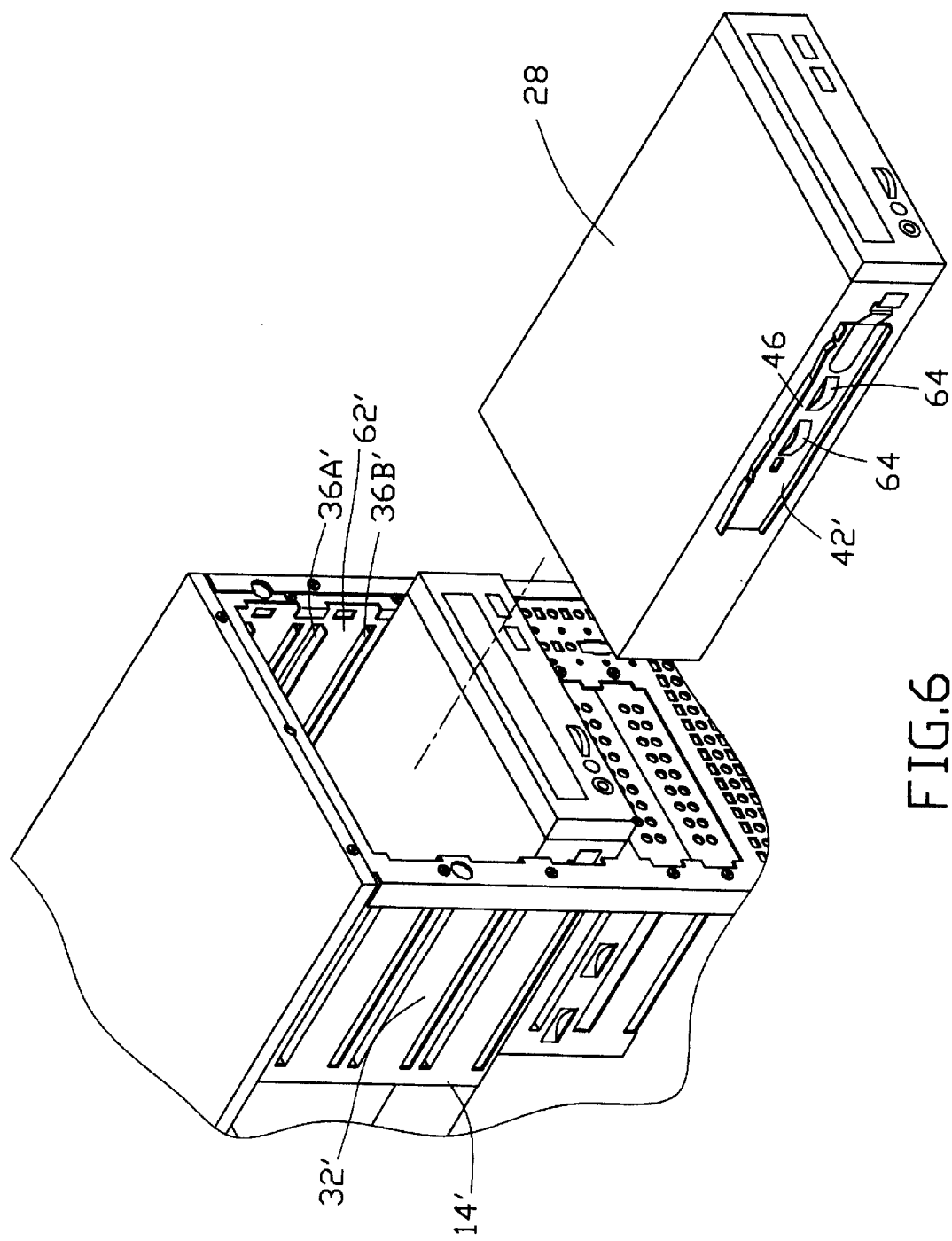
FIG. 6 is a partial perspective view of the second embodiment of an apparatus for mounting peripheral equipment of a computer to an enclosure thereof in accordance with the present invention showing the rails mounted to two CD ROMs, one CD ROM inserted into a bay of a drive cage and the other CD ROM outside the bay.

As shown in FIGS. 5 and 6, the rails 42' forming resilient loops 64 on the main body 46' are attached to the sides 44 of the CD ROM 28. The drive cage 14' has bends 36A', 36B' formed on the side wall 32' which define a channel 62' for slidably receiving the rail 42'. When the CD ROM 28 is inserted into the drive cage 14', the resilience keeps the loops 64 firmly connected with and abutting against the side wall 32' thereby firmly securing the CD ROM 28.

Figure 7:
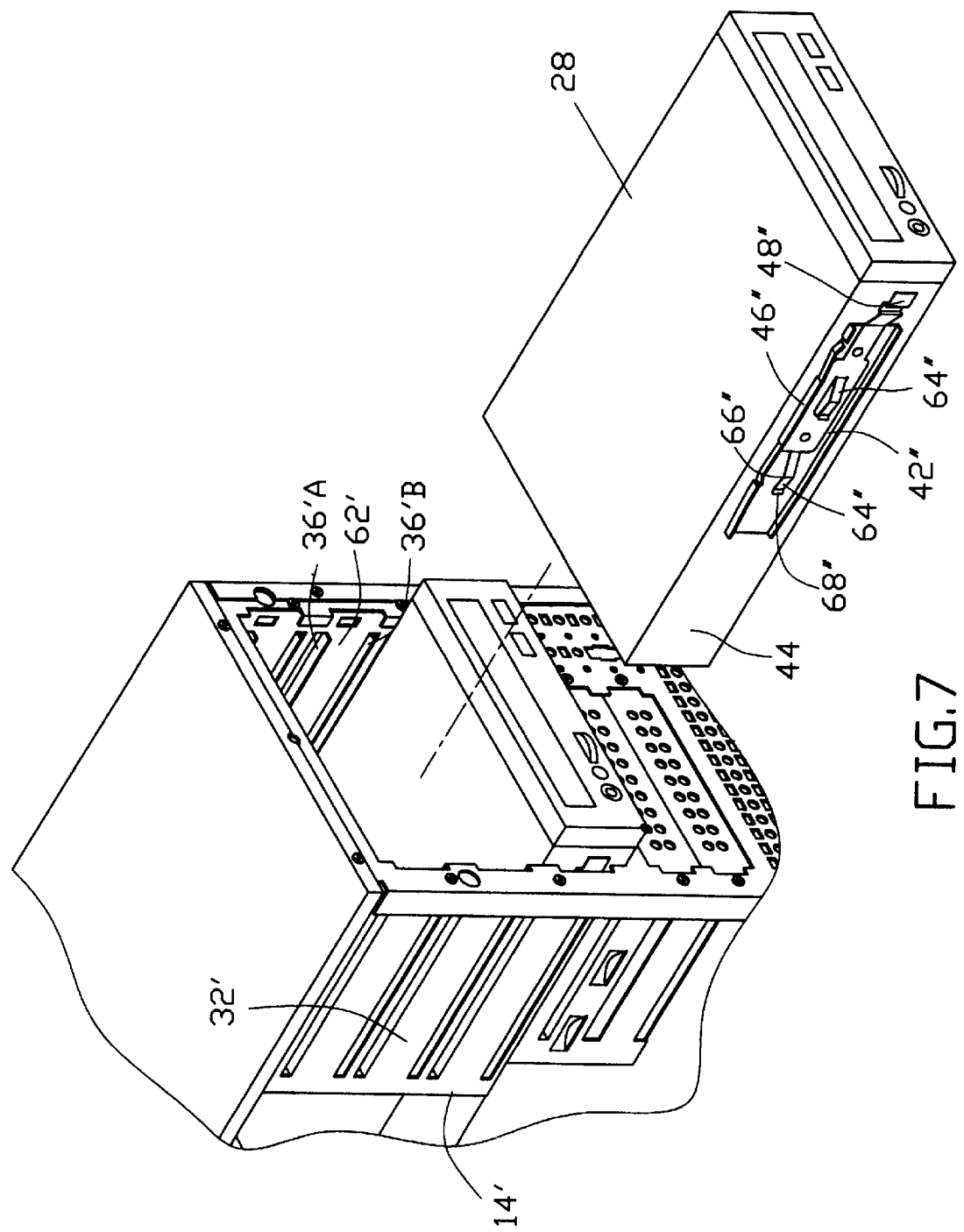
FIG. 7 is a partial perspective view of a third embodiment of an apparatus for mounting peripheral equipment of a computer to an enclosure thereof in accordance with the present invention showing the rails mounted to two CD ROMs, one CD ROM inserted into a bay of a drive cage and the other CD ROM outside the bay.

As shown in FIG. 7, the latch 48" forming folded resilient tabs 64" having a ridge 66" and an edge 68" thereon is attached to the main body 46" of the rail 42" fixed to the sides 44 of the CD ROM 28. When the CD ROM 28 is inserted into the drive cage 14', the resilience keys the tabs 64 connected with and abutting against the side wall 32' thereby firmly securing and grounding the CD ROM 28. The ridge 66" and edge 68" of the tabs 64" contact the side wall 32' and form two line-shaped grounding paths between the CD ROM 28 and the drive cage 14'.

While the present invention has been described in reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, persons of ordinary skill in this field are to understand that all such equivalent structures are to be included within the scope of the following claims.

We claim:

1. A railing means stamped from metal material for slidable installation of computer peripheral equipment into a computer chassis, comprising:

an elongate main body portion adapted to be positioned on a side of the computer peripheral equipment, the main body portion having integrally formed pins adapted to engage with holes of said computer peripheral equipment, a flange formed on a longitudinal side thereof, and at least one spring finger formed on said flange for preventing clearance from being formed between a bend of said computer chassis and said flange; and a separate latch mounted to said main body portion, the latch releasably engaging with the chassis, the latch comprising a ridge and an edge both extending away from the elongate main body, wherein the ridge and the edge form two line-shaped grounding paths between the computer peripheral equipment and the computer chassis.

* * * * *